US012662627B2

(12) United States Patent
Jacobs

(10) Patent No.: US 12,662,627 B2
(45) Date of Patent: Jun. 23, 2026

(54) WET ANISOTROPIC ETCHING OF SILICON

(71) Applicant: TEXAS INSTRUMENTS INCORPORATED, Dallas, TX (US)

(72) Inventor: Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/604,167

(22) Filed: Mar. 13, 2024

(65) Prior Publication Data

US 2024/0218250 A1      Jul. 4, 2024

Related U.S. Application Data

(62) Division of application No. 17/339,474, filed on Jun. 4, 2021, now Pat. No. 11,959,004.

(Continued)

(51) Int. Cl.
*C09K 13/02* (2006.01)
*C09K 13/00* (2006.01)
(Continued)

(52) U.S. Cl.
CPC .............. *C09K 13/02* (2013.01); *C09K 13/00* (2013.01); *H10P 50/642* (2026.01); *H10P 50/691* (2026.01)

(58) Field of Classification Search
None
See application file for complete search history.

(56) References Cited

U.S. PATENT DOCUMENTS 4,585,593 A * 4/1986 Keulemans ............... C11C 3/10
                                                              422/224
4,684,666 A * 8/1987 Haas ....................... A61P 25/04
                                                              514/557

(Continued)

FOREIGN PATENT DOCUMENTS

CN        105671642 A    6/2016
JP         11350167 A   12/1999
(Continued)

OTHER PUBLICATIONS

Pal et al., "High Speed Silicon Wet Anisotropic Etching for Applications in Bulk Micromachining: a Review," Feb. 22, 2021, Micro and Nano Systems Letters (2021) 9:4, 59 p.
(Continued)

*Primary Examiner* — Roberts P Culbert
(74) *Attorney, Agent, or Firm* — Michael T. Gabrik; Frank D. Cimino

(57)      ABSTRACT
An alkaline etching solution comprising a hydroxide salt (e.g., an alkali metal hydroxide, an ammonium hydroxide, or a combination thereof), a polyol having at least three hydroxyl (—OH) groups, and water. Also provided is a method of producing a semiconductor device by obtaining a semiconductor substrate having masked and unmasked surfaces; exposing the semiconductor substrate having the masked and unmasked surfaces to an alkaline etching solution, such that the unmasked surfaces of the substrate are anisotropically etched, wherein the alkaline etching solution comprises: a hydroxide salt; a polyol having at least three hydroxyl (—OH) groups; and water; and performing additional processing to produce the semiconductor device.

19 Claims, 2 Drawing Sheets

Related U.S. Application Data

(60) Provisional application No. 63/122,238, filed on Dec. 7, 2020.

(51) Int. Cl.
H10P 50/00 (2026.01)
H10P 50/64 (2026.01)

(56) References Cited

U.S. PATENT DOCUMENTS

| | | | | |
|---|---|---|---|---|
| 5,563,251 A | * | 10/1996 | Lachocki | C08G 65/2696 |
| | | | | 536/120 |
| 5,863,710 A | * | 1/1999 | Wakiya | G03F 7/322 |
| | | | | 430/311 |
| 5,911,836 A | * | 6/1999 | Hada | H01L 21/02071 |
| | | | | 134/28 |
| 6,225,030 B1 | * | 5/2001 | Tanabe | G03F 7/425 |
| | | | | 134/1 |
| 2004/0048761 A1 | * | 3/2004 | Ikemoto | G03F 7/425 |
| | | | | 510/176 |
| 2010/0298605 A1 | * | 11/2010 | Hirose | C07C 209/84 |
| | | | | 564/296 |
| 2013/0220420 A1 | | 8/2013 | Lachowicz et al. | |
| 2015/0152366 A1 | * | 6/2015 | Shimada | H01L 21/31111 |
| | | | | 438/618 |
| 2016/0358863 A1 | | 12/2016 | Asano et al. | |
| 2017/0015955 A1 | * | 1/2017 | Oie | C11D 7/12 |

FOREIGN PATENT DOCUMENTS

| | | | |
|---|---|---|---|
| JP | 4752867 | B2 | 8/2011 |
| KR | 20130070202 | A | 6/2013 |

OTHER PUBLICATIONS

Pal et al., "Silicon Wet Bulk Micromachining for MEMS," Apr. 7, 2017, pp. 121-122.

* cited by examiner

WET ANISOTROPIC ETCHING OF SILICON

CROSS-REFERENCE TO RELATED APPLICATIONS

The present application is a divisional to U.S. patent application Ser. No. 17/339,474, filed Jun. 4, 2021, which claims priority to U.S. Provisional Patent Application No. 63/122,238, which was filed Dec. 7, 2020, is titled "Improved Wet Anisotropic Etching of Silicon," which Applications are hereby incorporated herein by reference in their entireties.

BACKGROUND

Anisotropic wet etching of silicon is a process that is used for micromachining, such as for forming desired structures in the bulk of a silicon wafer that provide electrical, mechanical, or other functionality. Anisotropic silicon etchants are used around the globe in silicon micromachining, silicon wafer finishing, and solar cells.

SUMMARY

In accordance with at least one example of the description, an alkaline etching solution includes: a hydroxide salt (e.g., an alkali metal hydroxide, an ammonium hydroxide, or a combination thereof); a polyol having at least three hydroxyl (—OH) groups; and water.

In accordance with at least one example of the description, a method of producing a semiconductor device comprises: obtaining a semiconductor substrate having masked and unmasked surfaces; exposing the semiconductor substrate having the masked and unmasked surfaces to an alkaline etching solution, such that the unmasked surfaces of the substrate are anisotropically etched, wherein the alkaline etching solution comprises: a hydroxide salt; a polyol having at least three hydroxyl (—OH) groups; and water; and performing additional processing to produce the semiconductor device.

In accordance with at least one example of the description, a single crystal silicon substrate includes a single crystal silicon substrate fabricated such that its largest dimension is aligned with either a <100> or <110> plane of the crystal, and into which 3-dimensional structures have been etched using an alkaline etching solution including a hydroxide salt (e.g., an alkali metal hydroxide, an ammonium hydroxide, or a combination thereof); a polyol having at least three hydroxyl (—OH) groups; and water.

In accordance with at least one example of the description, a semiconductor substrate includes: one or more etched regions, wherein the semiconductor substrate is aligned to either a <100> or <110> Miller Index plane, wherein edges of the one or more etched regions are aligned to the complementary <100> or <110> plane, and wherein the one or more etched regions are created via anisotropic etching with an alkaline etching solution including: a hydroxide salt (e.g., an alkali metal hydroxide, an ammonium hydroxide, or a combination thereof); a polyol having at least three hydroxyl (—OH) groups; and water. The one or more etched regions can be rectangular or trapezoidal.

In accordance with at least one example of the description, a method of forming an assembly of two or more wafers comprises: bonding two or more wafers together with temporary or permanent bonding between faces thereof; and before or after the bonding, etching at least one of the two or more wafers with an alkaline etching solution including a hydroxide salt; a polyol having at least three hydroxyl (—OH) groups; and water.

DETAILED DESCRIPTION

Figures 1, 2, 3:
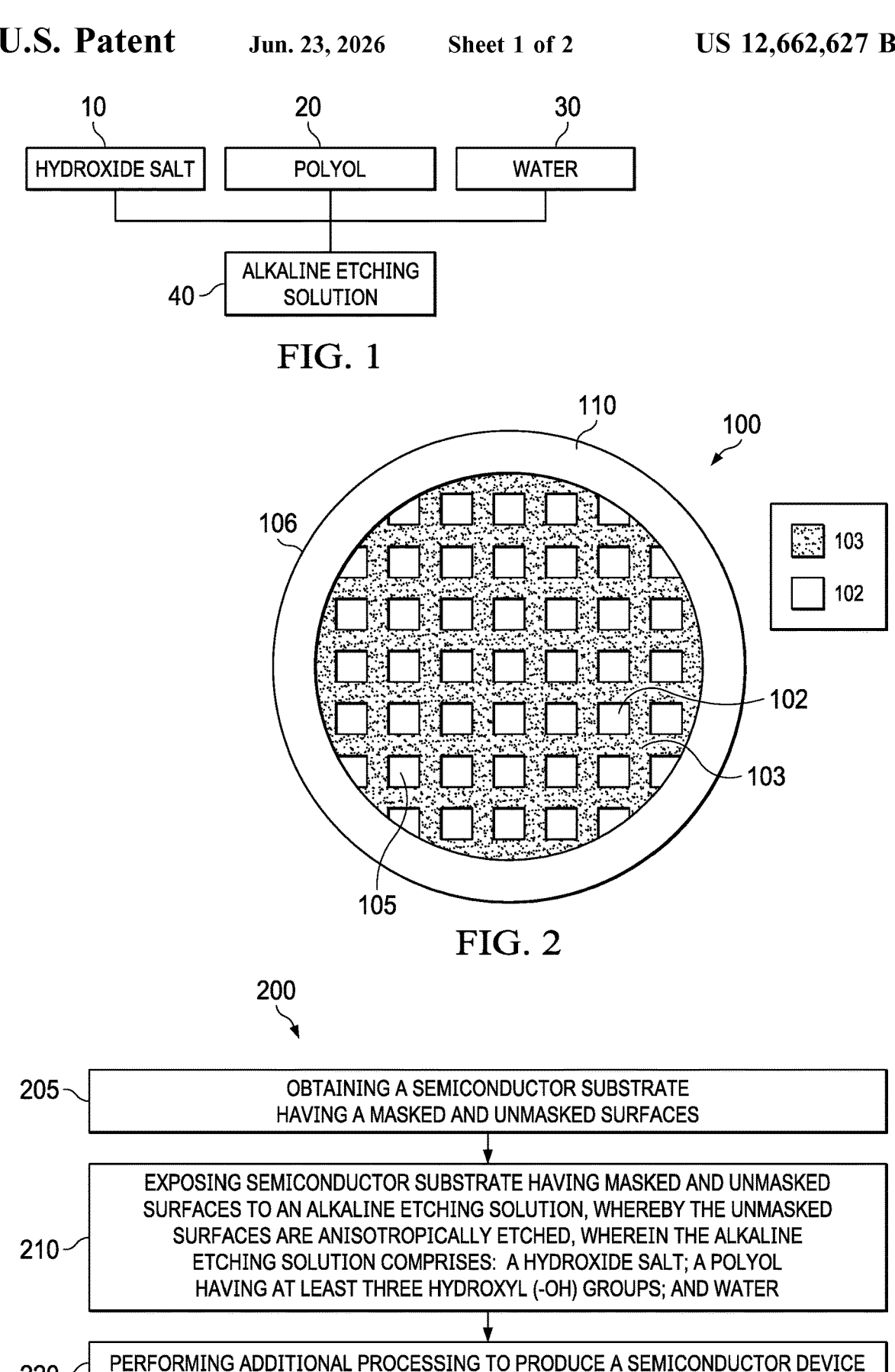
FIG. 1 is a schematic diagram of an alkaline etching solution in accordance with various examples.
FIG. 2 is a top-down view of a semiconductor substrate in accordance with various examples.
FIG. 3 is a flow diagram of a method in accordance with various examples.

As described above, anisotropic wet etching of silicon (Si) is a process that is used for micromachining, such as for forming desired structures in the bulk of a silicon wafer that provide electrical, mechanical, or other functionality. Anisotropic silicon etching solutions (or "etchants") have been studied since the 1950s. These etchants are now used in mass production around the globe in silicon micromachining, silicon wafer finishing, and solar cells.

The etching of silicon in basic solutions is a technical reality, but the chemistry is complex. A combination of chemical attack and electron transfer reactions happen simultaneously. The net reaction is purely electrochemical, but the hydroxide ion (OH⁻) is operable as a nucleophile to displace silicon atoms from the surface in order to achieve a reasonable etching rate.

The reaction according to Equation (1) below:

$$Si + 2\ H_2O \rightarrow SiO_2 + 2\ H_2 \tag{1}$$

occurs only at high pH (high hydroxide ion concentration) and elevated temperature)(50-100° C., where the overpotential for water reduction by elemental silicon is high enough to cause the fast silicon corrosion reaction.

The hydroxide ion participates in the reaction as a catalyst, but is consumed in the formation of hydrated silica from the sols that are produced, according to Equation (2):

$$SiO_2 + OH^- \rightarrow HSiO_3^- \tag{2}$$

Each Si atom removed from the surface has been discovered to consume an average of one hydroxide ion in this second step. As this secondary reaction consumes available hydroxide from the etchant, in this specification, effective compositions of the disclosed etching solutions are described according to their initial compositions, with the understanding that said compositions may vary over time as silicon is etched from the wafer and enters the etching solution as dissolved silicate species.

In some instances with large etching areas, multiple wafers, deep etching depths or all three of these elements, the volume of silicon consumed, and consequently the amount of dissolved silicon in the etchant, may increase sufficiently to affect the observed etch rates. Therefore, it may be desirable to remove a portion of the existing etching solution and replace the volume of solution removed with fresh solution, such that nearly constant etch rates for the etching areas and the masked areas of the wafer are maintained throughout the duration of the etch. Said fresh solution may contain any or all of the components of the initial etching solution in any ratio. For example, when etching with the alkaline etching solution described hereinbelow, the fresh solution can contain at least the hydroxide salt dissolved in at least one of the liquid components (water or polyol) of the etchant. This periodic replacement can be referred to as "bleed and feed." Bleed and feed is thus a strategy of periodically or continuously removing a portion of the etching solution from an etching bath while sequentially or simultaneously adding fresh solution, and is a manufacturing technique that can be used with wet etching solutions, such as the anisotropic alkaline silicon etching solutions described herein. The bleed and feed technique can be utilized to replenish lost hydroxide ion concentration while reducing the amount of dissolved silicon in the etching bath.

Anisotropic etching can be carried out utilizing hot alkaline solutions of alkali metal hydroxide, such as potassium hydroxide (KOH). An alternative is substitution of the potassium cation with an ammonium cation, $NR_1R_2R_3R_4^+$, wherein $R_1$—$R_4$ are independently hydrogen or an organic group. For example and without limitation, in examples the ammonium cation is a tetraalkylammonium cation, and the hydroxide salt includes tetraalkylammonium hydroxide (TAAH). In examples, the ammonium cation is a tetramethylammonium cation, in which example the hydroxide salt includes tetramethylammonium hydroxide (TMAH). In examples, the hydroxide salt includes ammonium hydroxide, also referred to as aqueous ammonia. In examples, the hydroxide salt includes aqueous solutions of organic amines, which react in aqueous solution to form mono-, di-, or trialkyl ammonium hydroxide salts. In examples, an organic di- or polyamine, such as ethylenediamine, serves as the source of hydroxide salt through such a reaction with water in the solution, and said hydroxide salt may be mono- or polybasic.

While etching with potassium hydroxide is faster, and the degree of anisotropy achieved therewith greater, potassium hydroxide has a rapid etching rate on some common masking materials, such as silicon dioxide ($SiO_2$). Tetraalkylammonium cations are generally considered complementary metal-oxide-semiconductor (CMOS)-compatible, while alkali metals (K, Na, Li, Rb, Cs) are not; however, silicon etch rates obtained with tetraalkylammonium hydroxide etchants (also referred to herein as "etching solutions") can be four or more times slower than silicon etch rates obtained with potassium hydroxide. Tetramethylammonium hydroxide thus offers a higher degree of selectivity than potassium hydroxide while allowing the use of silicon dioxide as a masking material, but the etching rate of silicon using tetramethylammonium hydroxide is only about 25% of the etching rate of silicon when using potassium hydroxide. The selectivity between silicon and silicon dioxide utilizing tetramethylammonium hydroxide etching solutions (absent the herein disclosed polyol) can range from about 300-500.

Choices of counterion, hydroxide salt concentration, and process temperatures affect the etching process outcomes. The ratio of the rates of etching of the fast-etching planes (e.g., the <100> and <110> planes of crystal silicon described in relation to FIG. 5B below) to the rate of etching of the slowest etching plane (e.g., the <111> plane of crystal silicon) is described as "anisotropy" and the etch as "anisotropic," i.e., the rate is not the same in all directions. By contrast, "isotropic" describes an etching rate that is the same in all directions. The etching rates of both the substrate and the mask 103 generally increase with temperature by individual Arrhenius relationships. The selectivity in the etching rate of silicon over silicon dioxide for etching solutions absent the herein disclosed polyol can be in a range of from about 50 to about 500, depending on the process parameters and etching solution utilized.

Accordingly, a problem that can be encountered when etching through all or substantially all of a substrate (e.g., a semiconductor wafer) is the concomitant etching of the mask, such as silicon dioxide. In the semiconductor industry, silicon dioxide is a preferred masking material compared to other masking materials, such as silicon nitride ($SiN_x$). While anisotropic etchants do not etch silicon nitride quickly or at all, the residual stress and defects encountered when working with silicon nitride as a masking material involve accommodation or even post-etch removal of the silicon nitride, resulting in a longer, more defective, and more expensive process than what can be done with silicon dioxide masks. However, even the most selective etches can consume two microns or more of silicon dioxide when etching to a depth of 500 microns. Depositing thick etch masks of silicon dioxide thus creates derivative problems associated therewith.

An embodiment disclosed herein preserves or enhances the rate of substrate (e.g., silicon wafer) etching while retarding or eliminating the etching of the mask (e.g., the silicon dioxide mask). As detailed below, the silicon etching rate can be increased while maintaining or increasing the selectivity between silicon and masking materials, such as silicon dioxide and silicon nitride. By including organic carbohydrate-related materials, as described below, in an alkaline etching solution (or "etchant"), the silicon etch rate can be increased, while maintaining or decreasing the etch rates of common masking materials, thus increasing the overall selectivity of the etch for silicon over the etching of the masking material.

By including polyol(s), such as organic polyols, having at least three hydroxyl (—OH) groups in the alkaline etching solution, as described below, one or both of the electrochemical and chemical reaction rates may be altered. While not wishing to be bound or limited by theory, both the dielectric constant of the reaction medium and the natures of the chemically reactive species may be changed by the addition of the polyol(s). These changes are observed as increases in the rate of silicon etching (up to two times or more the rate observed in an etchant absent the polyol) and a decrease in the rate of etching of the mask (e.g., silicon dioxide). In properly selected conditions, the etch selectivity of alkaline etching solutions of this description (e.g., TMAH-polyol etching solutions) can effectively approach infinity. Enhanced etching activity is also evident in alkaline etching solutions of this description including potassium hydroxide as the hydroxide salt, although, again without being limited by theory, it is believed that the rates and active species change in response to a change of the cation between potassium and tetramethylammonium. This is evident in the disparate effects of different compounds on the reaction milieu in alkaline etching solutions of this description containing potassium hydroxide and those containing tetramethylammonium hydroxide, as seen in the Examples below. The alkaline etching solutions of this description can provide for faster silicon etch rates and increased selectivity (e.g., reduced etch rates for oxide hard masks).

FIG. 1 is a schematic of an alkaline etching solution in accordance with various examples of this description. As shown schematically in FIG. 1, an alkaline etching solution 40 of this description includes a hydroxide salt 10, a polyol 20, and water 30. The hydroxide salt 10 can include an alkali metal hydroxide, an ammonium hydroxide, such as, without limitation, a tetraalkylammonium hydroxide, or a combination thereof. In aspects, the hydroxide salt 10 includes an alkali metal hydroxide, such as potassium hydroxide (KOH), sodium hydroxide (NaOH), lithium hydroxide (LiOH), rubidium hydroxide (RbOH), cesium hydroxide (CsOH), or a combination thereof. For example, in some specific applications, the alkali metal hydroxide includes potassium hydroxide (KOH); in some specific examples, the hydroxide salt 10 includes an ammonium hydroxide; in some specific examples, the ammonium hydroxide includes a tetraalkylammonium hydroxide, such as, without limitation, tetramethylammonium hydroxide.

The alkaline etching solution 40 can have a pH of greater than or equal to about 13, 13.25, or 13.5. In examples, the alkaline etching solution 40 has a pH of less than or equal to about 14, 13.75, or 13.5. In examples, the alkaline etching solution 40 has a pH in a range of from about 13 to about 14, from about 13.25 to about 14, from about 13.5 to about 14, or from about 13.25 to about 13.5.

In examples, the alkaline etching solution 40 can include: from about 5 to about 50, from about 2 to about 15, from about 5 to about 20, or from about 10 to about 50 weight percent of the hydroxide salt 10 (e.g., of the alkali metal hydroxide, the ammonium hydroxide, or the combination thereof); from about 35 to about 85, from about 40 to about 80, from about 45 to about 85, or from about 35 to about 75 weight percent of the polyol 20; and/or from about 5 to about 50, from about 5 to about 45, from about 10 to about 40, or from about 20 to about 50 weight percent of the water 30.

In examples, the alkaline etching solution 40 includes a hydroxide salt solution formed in a mixture of one or more (e.g., organic) polyols 20 and water 30 with a boiling point above 100° C. In examples, a mass ratio of the polyol 20 to the water 30 in the alkaline etching solution 40 is in a range of from about 0.5 to about 5, from about 1 to about 5, from about 2 to about 5, from about 3 to about 5, from about 2 to about 4, or from about 3 to about 4. For example, in examples, the alkaline etching solution 40 can include a mixture of glycerol (as the polyol 20) and water 30 containing at least 70, 75, 80, or 85 weight percent glycerol, that is combined with the hydroxide salt 10 to form the alkaline etching solution 40.

According to this disclosure, the polyol includes at least three hydroxyl (—OH) groups. The polyol 20 can have the structure: R—(CH(OH))$_m$—R'—(CH(OH))$_n$—R", wherein m and n are each greater than or equal to 1 and/or m+n is greater than 3, or (when the interposing R' group is absent) can have the structure: R—(CH(OH))$_x$—R', wherein x is greater than or equal to 3. The R, R', and R" can each independently include hydrogen, a functionalized or non-functionalized alkyl, aryl, alkoxy, sulfoxide, or sulfone group, or another organic functional group that is stable under the etching conditions. In examples, the polyol 20 is a simple sugar alcohol having the general formula R—(CH (OH))$_x$—R'. For example, the polyol 20 can include glycerol (also referred to as "glycerin" or "glycerine"), erythritol, xylitol, sorbitol, mannitol, or a combination thereof. In examples, the polyol 20 includes glycerol, erythritol, xylitol, sorbitol, mannitol, or a combination thereof. In examples, the polyol 20 includes glycerol. In examples, the polyol 20 is a triol.

In examples, the polyol 20 is a polymeric polyol including a mixture of varying chain length polymers having one or more repeating monomer units, wherein one or more of the repeating monomer units have more than one hydroxyl group and/or wherein end groups of the varying chain length polymers contain more than one hydroxyl group.

In examples, the alkaline etching solution 40 has a boiling point greater than the boiling point of water (i.e., greater than 100° C.). In examples, the boiling point of the alkaline etching solution 40 is greater than or equal to about 105° C., 110° C., 115° C., or 120° C.

Also disclosed herein is a method of etching a semiconductor substrate. A method of etching a semiconductor substrate according to examples of this description will now be described with reference to FIG. 2, which is a schematic top view of a semiconductor substrate 100 suitable for etching via the disclosed method, and FIG. 3, which is a flow diagram of a method 200 of etching a semiconductor substrate 100 and/or producing a semiconductor device in accordance with various examples. As shown in FIG. 2, a semiconductor substrate 100 etched via the alkaline etching solution 40 and method 200 of this description can have a surface 110 (e.g., a top or front surface or a bottom or back surface) including masked surfaces 101 (not shown in FIG. 2 but shown in FIG. 5B described below) covered by a mask 103 (shaded areas of FIG. 2) and unmasked surfaces 102 (white areas of FIG. 2), and a perimeter 106. In the example of FIG. 2, the semiconductor substrate 100 is a wafer having a substantially round cross section, but other shapes of the semiconductor substrate 100 are within the scope of this description. The mask 103 can separate substantially rectangular unmasked regions 105, as in the example of FIG. 2.

With reference to FIG. 3, a method 200 of etching a semiconductor substrate 100 and/or producing a semiconductor device includes: exposing, 210, a semiconductor substrate 100 having masked surfaces 101 and unmasked surfaces 102 to an alkaline etching solution 40, such that the unmasked surfaces 102 of the semiconductor substrate 100 are anisotropically etched. The alkaline etching solution 40 is as described hereinabove with reference to FIG. 1, and includes: a hydroxide salt 10 (e.g., an alkali metal hydroxide, an ammonium hydroxide, or a combination thereof); a polyol 20 having at least three hydroxyl (—OH) groups; and water 30. As noted above, the semiconductor substrate 100 can be a silicon wafer, in examples. As depicted in FIG. 3, the method 200 can further include obtaining a semiconductor substrate 100 having masked and unmasked surfaces at 205 and/or performing additional processing to produce a semiconductor device at 220.

The masked surfaces 101 have deposited thereon a mask 103 (shaded material in FIG. 2). The mask 103 can include a material that etches more slowly than the semiconductor substrate 100 and is inert under the etching conditions. For example, in examples, the mask 103 includes a material selected from silicon dioxide (SiO$_2$; also referred to as silica), silicon nitride (SiN$_x$), silicon oxynitride (SiO$_x$N$_y$), or combinations thereof. The mask 103 can be grown by any suitable means. For example, mask 103 can be grown by oxidation or deposited by a thin film method. Such thin film methods include, without limitation, low pressure chemical vapor deposition (LPCVD) or plasma-enhanced chemical vapor deposition (PECVD). In examples, the mask 103 includes a metal that is inert under the etching conditions, such as, without limitation, gold with a chromium adhesion layer.

The unmasked surfaces 102 of the semiconductor substrate 100 are etched via method 200 at a substrate etching rate and the mask 103 is etched at a mask etching rate. In examples, an etching selectivity, defined as a ratio of the semiconductor substrate 100 etching rate to the mask 103 etching rate, is greater than or equal to about 500, 600, 700, 800, 900, 1000, 2000, 3000, 4000, 5000, 6000, 7000, 8000, 9000, 10000, 11000, 12000, or more.

Figure 4:
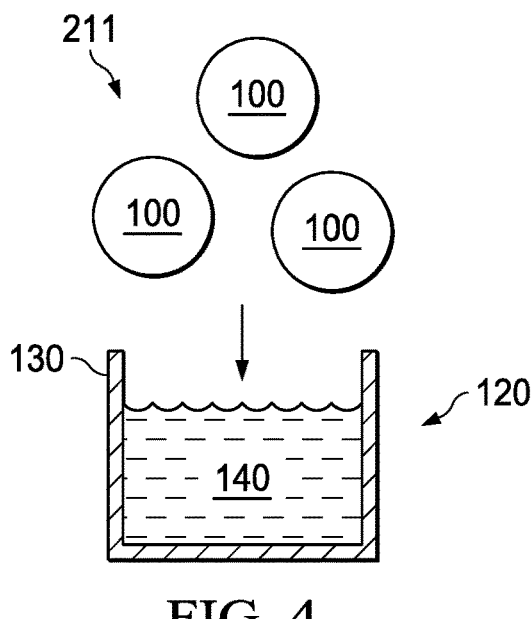
FIG. 4 is a flow drawing of the exposure of a semiconductor substrate to an alkaline etching solution in accordance with various examples.

As shown in FIG. 4, which is a flow drawing of exposing, 211, a semiconductor substrate 100 to an alkaline etching solution 40 (pictured in FIG. 1), in examples, exposing the semiconductor substrate 100 to the alkaline etching solution 40 (at 210 of FIG. 3) includes submerging the semiconductor substrate 100 in a volume 140 of the alkaline etching solution 40. The volume 140 of the alkaline etching solution 40 can be contained in a container or vessel 130 to provide an etchant bath 120. Subsequent to the semiconductor substrate 100 being submerged in the alkaline etching solution 40, exposed unmasked surfaces 102 and masked surfaces 101 of the submerged semiconductor substrate 100 are subjected to etching by the alkaline etching solution 40. The etching rate of the mask 103 on the masked surfaces 101 exposed to the alkaline etching solution 40 will be less than the etching rate of the unmasked surfaces 102 exposed to the alkaline etching solution 40.

In examples, one or, as in the example of FIG. 4, more than one semiconductor substrates 100 can be submerged into the volume 140 of the alkaline etching solution 40 simultaneously. A special cartridge or holder can be utilized to protect certain surfaces that are not to be etched from the alkaline etching solution 40 and/or such surfaces can be masked with the mask 103 or another masking material. In this manner the sides (e.g., top and bottom/front and back) of a semiconductor substrate 100 (e.g., a wafer) can be etched simultaneously or sequentially. For example, a cartridge can be utilized to hold a semiconductor substrate 100 such that a front surface 110 thereof is directed toward the volume 140 of the alkaline etching solution 40 when submerged into the volume 140 of the alkaline etching solution 40, while the cartridge can protect the reverse side of the semiconductor substrate 100 and the perimeter or edges 106 thereof from the alkaline etching solution 40.

The volume 140 of the alkaline etching solution 40 can have a temperature approximately equal to a boiling point of the alkaline etching solution 40, in a range of from about 3° C. to about 5° C. below the boiling point of the alkaline etching solution 40, or in a range of from about 5° C. to about 15° C. below the boiling point of the alkaline etching solution 40. The temperature of the volume 140 of the alkaline etching solution 40 is selected to provide an acceptable substrate (e.g., silicon) etching rate, at which desirable semiconductor substrate 100 net shape and surface characteristics are obtained. Generally, a higher temperature, at or near (e.g., 5-15 degrees Celsius below) the boiling point of the alkaline etching solution 40, can be utilized to increase the semiconductor substrate 100 etch rate (which increases with increasing temperature) and decrease the viscosity of the alkaline etching solution 40 (which viscosity decreases with increasing temperature). In examples, the volume 140 of the alkaline etching solution 40 into which the semiconductor substrate(s) 100 is (are) submerged has a temperature of greater than or equal to about 105° C., 110° C., 115° C. or higher.

In examples, a composition of the alkaline etching solution 40 is maintained substantially constant for the duration of the etching (e.g., the duration of the submerging and exposing of the unmasked surfaces 102 to the alkaline etching solution 40) via intermittent or continuous removal of a portion of the alkaline etching solution 40 and replacement by (e.g., introduction into the etchant bath 120 of) about the same volume of a fresh solution, wherein the fresh solution comprises at least one of the components of the alkaline etching solution 40 (i.e., the hydroxide salt 10, the polyol 20, and/or the water 30), such that a substantially constant etching rate of the unmasked surfaces 102 is maintained for the duration of the etching process.

In examples, the anisotropic etching is effected via method 200 with an etching selectivity of the substrate 100 to the mask 103, defined as the ratio of the etch rate of the substrate 100 to the etch rate of the mask 103, in a range of from about 550 to about 12500, from about 600 to about 12500, or from about 700 to about 12500. In examples, the etching selectivity is greater than or equal to about 500, 550, 600, 700, 800, 900, 1000, 2000, 3000, 4000, 5000, 6000, 7000, 8000, 9000, 10000, 11000, 12000, or more. In examples, the etching selectivity provided by the method 200 is greater than an etching selectivity obtained via etching of the semiconductor substrate 100 with an otherwise similar alkaline etching solution absent the polyol 20.

In aspects, the semiconductor substrate 100 includes a microelectronic device wafer. Also disclosed herein is a semiconductor substrate 100 (e.g., a microelectronic device wafer) etched before, during, and/or after other fabrication steps thereof using the alkaline etching solution 40 described herein. In aspects, the semiconductor substrate 100 is a CMOS wafer, and the hydroxide salt 10 includes a tetraalkylammonium hydroxide, such as tetramethylammonium hydroxide. For example, in examples, a semiconductor substrate 100 (e.g., a microelectronic device wafer) is etched, using the alkaline etching solution 40 described herein, before, during, and/or after incorporation of elements or structures formed by other means (e.g., circuitry, mechanical structures, and the like, whether said elements or structures are intended to be temporary or permanent).

Figure 5A:
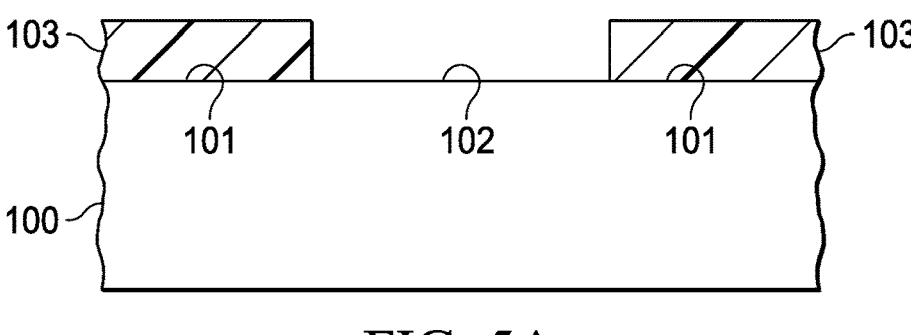
FIG. 5A is a cross sectional view of a portion of a semiconductor substrate before exposing the semiconductor substrate to an alkaline etching solution, in accordance with various examples.
Figure 5B:
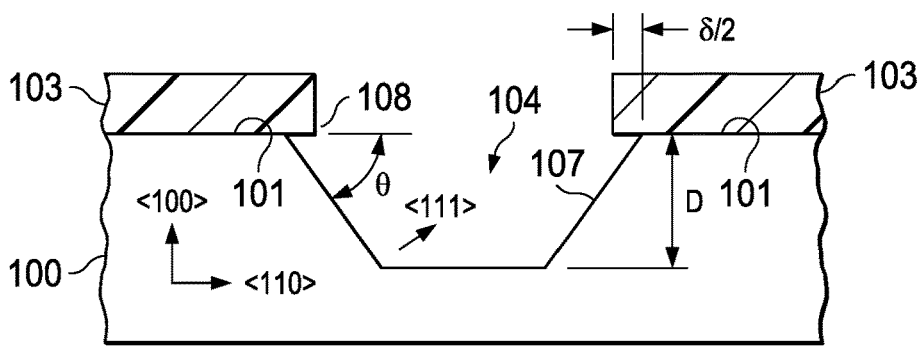
FIG. 5B is a cross sectional view of a portion of a semiconductor substrate after exposing the semiconductor substrate to an alkaline etching solution, in accordance with various examples.

FIG. 5A and FIG. 5B are schematic cross section views of a portion of a semiconductor substrate 100 before and after, respectively, exposing the semiconductor substrate 100 to the alkaline etching solution 40 (pictured in FIG. 1), in accordance with various examples. As seen in FIG. 5A, the portion of the semiconductor substrate 100 has masked surfaces 101, having mask 103 thereon, and unmasked surfaces 102, as described above with reference to FIG. 2. As shown in FIG. 5B, subsequent anisotropic etching of the semiconductor substrate 100 as described herein, an etched region 104 is formed in the semiconductor substrate 100. The etched region 104 can include a trench or trapezoidal etched region. For silicon substrates, the angle θ of the <111> oriented sidewalls 107 of the trench or etched region 104 relative to the <100> oriented surface 110 of the semiconductor substrate 100 can be about 54.7°, as shown in FIG. 5B. An undercut δ under an edge of the mask 103 can be formed during the anisotropic etching carried out by the method 200 of this description. The undercut δ (in units of length) can be calculated as $\sqrt{6}D/S$, where D is the etch depth (in units of length) and S is the anisotropy of the semiconductor substrate 100 and etchant or $\sqrt{6}TR_{111}$, where T is the etch time and $R_{111}$ is the etch rate in the <111> direction. In examples, the etched region 104 includes at least one trench which serves to physically or electronically separate different regions of the wafer or semiconductor substrate 100. The alkaline etching solution 40 and method 200 described herein can be utilized to anisotropically etch the semiconductor substrate 100 in a variety of ways, without limitation. For example, in examples, the etched region 104 includes the back (inactive) face of a CMOS wafer, wherein the back is etched via the alkaline etching solution 40 and method 200 of this description to thin the CMOS wafer or chemically remove damage after a thickness of the CMOS wafer was reduced by other means. In examples, the semiconductor substrate 100 (e.g., CMOS wafer) can be separated into individual substantially identical microelectronic devices, in whole or in part, via etching with the alkaline etching solution 40 and method 200 of this description. In examples, the etched region(s) 104 provides a recessed area where one or more separately fabricated microelectronic devices can be attached to the semiconductor substrate 100 subsequent the etching. For example and without limitation, in aspects the semiconductor substrate 100 is a CMOS driver circuit, and, subsequent etching as described herein, a III-V device can be heterogeneously integrated into the recess on the CMOS circuit.

Also provided herein is a method of forming an assembly of two or more wafers or semiconductor substrates 100. The method comprises bonding the two or more wafers or semiconductor substrates 100 together with temporary or permanent bonding between faces thereof, wherein before or after the bonding, at least one of the two or more wafers or semiconductor substrates 100 are etched using the alkaline etching solution 40 and method 200 of this description.

With reference to FIG. 5B, also provided herein is a single crystal silicon semiconductor substrate 100 fabricated such that its largest dimension is aligned with either a <100> or <110> plane of the crystal, into which 3-dimensional structures have been etched using the herein disclosed alkaline etching solution 40 and method 200.

Still with reference to FIG. 5B, in examples, a semiconductor substrate 100 of this description includes: one or more (e.g., rectangular or trapezoidal) etched regions 104, wherein the semiconductor substrate 100 is aligned to either a <100> or <110> Miller Index plane, wherein edges of the one or more (e.g., rectangular or trapezoidal) etched regions 104 are aligned to the complementary <100> or <110> plane, and wherein the one or more (e.g., rectangular or trapezoidal) etched regions 104 are created via anisotropic etching with the alkaline etching solution 40 and method 200 of this description.

While certain components may be described herein as being of a particular process technology, these components may be exchanged for components of other process technologies. Circuits described herein are reconfigurable to include the replaced components to provide functionality at least partially similar to functionality available prior to the component replacement.

Additions to the alkaline etching solution 40 chemistry as described herein can be utilized to increase the etch rates of silicon. In many cases, this is accomplished while maintaining or even decreasing the etch rates of a mask (e.g., silicon dioxide), increasing the overall selectivity of the etch for silicon over the mask (e.g., silicon dioxide), thus enabling the creation of more selective etches. This can be a distinct advantage in some applications, such as in applications that employ a thin, thermally grown silicon dioxide as a sole masking material for a long duration etch that removes all or substantially all of the semiconductor substrate 100 (e.g., wafer) in certain areas.

Utilization of the alkaline etching solution 40 of this description can provide for economic benefit with higher manufacturing throughput, via additions to the alkaline etching solution 40. In examples with additions to the alkaline etching solution 40 that can, in examples, be non-toxic. In the case of tetramethylammonium hydroxide, the alkaline etching solution 40 is CMOS-compatible.

In examples, polyols 20 include organic polyols having at least three hydroxyl (—OH) groups are incorporated into a tetramethylammonium hydroxide etching solution at concentration ranges which cause the etching rate of silicon to increase. This beneficial effect can be obtained with organic compounds containing vicinal hydroxyl groups, starting with 3 adjacent hydroxyl groups, and extending through compounds of general formula R—$(CHOH)_n$—R', where R, R' are selected from alkyl, alkoxy, or hydrogen, and n≥3, as described herein. In examples, the incorporation of simple sugar alcohol(s), such as glycerin, erythritol, xylitol, and sorbitol (as opposed to simple sugars, which are chemically unstable at etching conditions) exhibit concentration-dependent beneficial effects, and an alkaline etching solution 40 as described herein can provide for a moderate acceleration of the etching rate of silicon and a moderate to significant decrease to total elimination of the etching rate of masking materials of mask 103, such as silicon dioxide, during the course of the etch.

In aspects, an alkaline etching solution 40 for anisotropic etching of a semiconductor substrate 100 (e.g., a silicon wafer) contains an alkali metal or ammonium hydroxide salt (e.g., tetraalkylammonium hydroxide) and a polyol of the formula R—$(CHOH)_n$—R', where R, R' are selected from alkyl, alkoxy, or hydrogen and n≥3, as described hereinabove.

The use of the alkaline etching solution 40 also facilitates escape of hydrogen bubbles from the etchant bath 120 due to the reduced surface tension of the alkaline etching solution 40 relative to water or etching solutions absent the polyol 20 having the at least three hydroxyl (—OH) groups.

In examples, the continuous manufacturing technique of "bleed and feed" can be utilized, whether intermittently or continuously, during the etching process in order to replenish lost hydroxide ion concentration and reduce the amount of dissolved silicon in the etchant bath 120.

EXAMPLES

The examples having been generally described, the following examples are given as particular examples of the description and to demonstrate the practice and advantages thereof. It is understood that the examples are given by way of illustration and are not intended to limit the specification or the claims in any manner.

Example 1

Experiments were conducted utilizing an alkaline etching solution 40 of this description including potassium hydroxide as the hydroxide salt 10, and a variety of polyols 20. Table 1 shows the performance, at 80° C. and 90° C., of alkaline etching solutions 40 including a sugar alcohol polyol 20 according to examples of this description, a comparative example using propylene glycol, and a control run in which the alkaline etching solution contained no polyol 20.

TABLE 1

| Results from Example 1 | | | | | |
|---|---|---|---|---|---|
| Hydroxide Salt | Temp. (° C.) | Polyol | Silicon Etch Rate (µm/h) | PECVD Mask Etch Rate (Å/h) | Selec-tivity | Silicon Etch Rate * Selec-tivity |
| Experiment 1: 30 min. etch: | | | | | | |
| 20% KOH | 80 | Propylene Glycol | 87.21 | 7000 | 124.59 | 10865.12 |
| 20% KOH | 80 | Glycerol | 123.93 | 7600 | 163.07 | 20208.74 |
| 20% KOH | 80 | Erythritol | 128.52 | 7500 | 171.36 | 22023.19 |
| 20% KOH | 80 | Xylitol | 128.52 | 7800 | 164.77 | 21176.14 |
| 20% KOH | 80 | Sorbitol | 133.11 | 7600 | 175.14 | 23313.52 |
| 20% KOH | 80 | Mannitol | 119.34 | 8300 | 143.78 | 17159.08 |
| Experiment 2: 20 min etch: | | | | | | |
| 20% KOH | 90 | None (Control) | 220.32 | 14100 | 156.26 | 34426.17 |
| 20% KOH | 90 | Erythritol | 261.63 | 12600 | 207.64 | 54325.60 |
| 20% KOH | 90 | Xylitol | 220.32 | 12300 | 179.12 | 39464.15 |
| 20% KOH | 90 | Sorbitol | 261.63 | 17700 | 147.81 | 38672.46 |
| Experiment 3: 20 min. etch: | | | | | | |
| 20% KOH | 90 | Erythritol | 206.55 | 10800 | 191.25 | 39502.69 |
| 20% KOH | 90 | Xylitol | 240.98 | 14100 | 170.90 | 41183.65 |
| 20% KOH | 90 | Sorbitol | 220.32 | 17100 | 128.84 | 28386.49 |
| Experiment 4: 20 min. etch: | | | | | | |
| 20% KOH | 90 | Erythritol | 165.24 | 11700 | 141.23 | 23336.97 |
| 20% KOH | 90 | Xylitol | 199.67 | 11400 | 175.14 | 34970.27 |
| 20% KOH | 90 | Sorbitol | 192.78 | 13800 | 139.70 | 26930.53 |

The control entry (CTRL) for 90° C. shows an etch rate of 220 microns/hour and a "merit factor" (equal to the silicon etch rate times the selectivity) of 34426. As seen in Table 1, enhanced selectivity and merit factor are provided by the addition of various sugar-alcohols to the alkaline etching solution 40, as described herein.

Example 2

Experiments were conducted utilizing an alkaline etching solution 40 of this description including a variety of polyols 20 and tetramethylammonium hydroxide as the hydroxide salt 10. Table 2 shows the performance, at 90° C., of alkaline etching solutions 40 including a sugar alcohol polyol 20 according to examples of this description, a comparative example using propylene glycol, and a control utilizing an alkaline etching solution absent any polyol 20.

TABLE 2

| Results from Example 2 | | | | | |
|---|---|---|---|---|---|
| Hydroxide Salt | Polyol | Silicon Etch Rate (µm/h) | PECVD Mask Etch Rate (Å/h) | Selectivity | Silicon Etch Rate *Selectivity |
| | | Experiment 1: 30 min. etch: | | | |
| 25% TMAH | Sorbitol | 64.26 | 2 | 321300 | 20,646,738 |
| 25% TMAH | Xylitol | 78.03 | 102 | 7650 | 596,929 |
| 25% TMAH | Propylene Glycol | 55.08 | 2102 | 262 | 14430 |
| 25% TMAH | None (Control) | 68.85 | 902 | 763 | 52533 |

As can be seen in Table 2, the control run provided an etch rate of 68.85 microns/hour and a selectivity of 763.3. The enhanced selectivity of alkaline etching solutions 40 including a sugar alcohol polyol 20 as described herein is evident on inspection of the first two rows of Table 2, as the addition of longer sugar alcohols effectively stopped the etching of the silicon dioxide mask 103 material under the etching conditions.

Example 3

Experiments were conducted utilizing an alkaline etching solution 40 of this description including tetramethylammonium hydroxide as the hydroxide salt 10 and glycerol as the polyol 20. Runs 1-5 employed alkaline etching solutions 40 as described herein, having a variety of mass ratios of the polyol 20 to the water 30 (GLY/H$_2$O); run 6 was a control run in which the alkaline etching solution did not contain any polyol/glycerol. Table 3 shows the results of these experiments.

TABLE 3

| Results from Example 3 | | | | | | | |
|---|---|---|---|---|---|---|---|
| Run # | Temp. (° C.) | GLY/H$_2$O Mass Ratio | TMAH (wt. %) | GLY (wt. %) | H$_2$O (wt. %) | Silicon Etch Rate (µm/h) | PECVD Mask Etch Rate (Å/h) | Selec-tivity |
| 1 | 124 | 5 | 5.33 | 78.7 | 16.0 | 110 | 708 | 1550 |
| 2 | 120 | 4 | 6.33 | 74.7 | 18.9 | 116 | 166 | 6980 |
| 3 | 123 | 3 | 7.78 | 68.9 | 23.3 | 150 | 606 | 2480 |
| 4 | 117 | 2 | 10.10 | 59.6 | 30.3 | 150 | 1425 | 1050 |
| 5 | 112 | 1 | 14.38 | 42.5 | 43.2 | 146 | 3000 | 490 |
| 6 (Control) | 90 | 0 | 10 | 0 | 90 | 46 | 1100 | 420 |

As can be seen in the results in Table 3, the silicon etch rate and selectivity increased relative to the control for all Runs 1-5. As seen in comparing the results from Runs 1-3 with those of Comparative Run 6, polyol 20 to water 30 mass ratio in the range of 3-5 increased the silicon etch rate relative to the silicon etch rate obtained with the control etching solution of Run 6 absent the polyol 20, while decreasing the mask 103 etch rate relative to that of the control Run 6. Polyol 20 to water 30 mass ratios in the range of 2-5 showed enhanced selectivity more than double the selectivity obtained with the control etching solution of Run 6.

Again with reference to Table 3, the data show that the peak selectivity and etch rates are achieved in solutions including both the water 30 and the polyol 20. Without wishing to be limited by theory, it is noted that a combination of water 30 and polyol 20 may provide better results than water or polyol alone for a number of reasons, which may include, without limitation, water 30 being a better solvent for the silicates, polyols 20 having at least three hydroxyl (—OH) groups being more difficult to reduce, and/or water 30 lowering the viscosity of the alkaline etching solution 40 relative to the viscosity of pure polyol 20. It is suggested, without wishing to be limited by theory, that the complex nature and multiplicity of the reactions in solution involve a combination of properties not available in the use of either water 30 or polyol 20 alone.

Example 4

Experiments, similar to those of Example 3, were conducted utilizing an alkaline etching solution 40 of this description including tetramethylammonium hydroxide as the hydroxide salt 10 and glycerol as the polyol 20. Runs 7-11 employed alkaline etching solutions 40 as described herein, having a variety of mass ratios of the polyol 20 to the water 30 (GLY/$H_2$O). Table 4 shows the results of these experiments. These experiments were conducted on full 200 mm wafers with masking. In these experiments, thermally grown $SiO_2$ nominally 200 nm thick was used as the masking material of mask 103. Referring once more to the Figures, the geometries of wafers used in this experiment are shown in FIG. 2. The etchant bath 120 used is as illustrated in FIG. 4. The cavity geometry before etching is shown in FIG. 5A, and after etching, FIG. 5B. Three wafers were etched in each experiment, one each at the front, middle, and back of a 25-wafer cassette. Cavity depth was determined by optical measurement.

TABLE 4

| | | | | | | Thermal SiO$_2$ | |
|---|---|---|---|---|---|---|---|
| Run # | Temp. (° C.) | GLY/H$_2$O Mass Ratio | Volume Glycerin (L) | Volume 25% TMAH (L) | Silicon Etch Rate (μm/h) | Mask Etch Rate (Å/h) | Selectivity |
| 7 | 125 | 5 | 14.25 | 4.75 | 73 | 58.4 | 12500 |
| 8 | 125 | 4.5 | 14.25 | 5.28 | 75 | 162 | 4630 |
| 9 | 125 | 4 | 14.25 | 5.94 | 75 | 146 | 5140 |
| 10 | 125 | 3.5 | 14.25 | 6.79 | 98 | 199 | 4920 |
| 11 | 125 | 3 | 14.25 | 7.92 | 109 | 88.2 | 12400 |

Results from Wafer Experiments of Example 4

Without wishing to be limited by theory, the results from the wafer experiments with respect to etch rate are lower in this Example 4 because the wafers demonstrated an induction time before the etching started ranging from 2-5 minutes, likely attributable to formation of a thin native oxide on the cavities due to a delay of several weeks between the mask etching and the silicon anisotropic etching. Again without wishing to be limited by theory, the selectivities in the wafer experiments of this Example 4 may be higher than those in Example 3 because of the use of thermal oxide as mask 103 in these wafer experiments vs. the experiments of Example 3, where PECVD SiO$_2$ was used as a mask 103. In all cases, the selectivity and etch rates demonstrate the benefits of the present invention vs. the control entry in table 3. The extraordinary selectivities observed in these wafer experiments highlight two benefits of the disclosed alkaline etching solution 40 and method of use thereof, namely, the ability to use only a thin thermal oxide as a mask 103 for etch depths of hundreds of microns, corresponding to complete removal of silicon from the unmasked areas, and the reduced process time to accomplish the complete removal of silicon. Thus the present invention has broad benefit and applicability, for example, to fabrication of microelectromechanical system (MEMS).

Additional Examples

The following are nonlimiting, specific examples in accordance with this description:

In a first example, an alkaline etching solution includes: a hydroxide salt (e.g., an alkali metal hydroxide, an ammonium hydroxide, or a combination thereof); a polyol having at least three hydroxyl (—OH) groups; and water.

A second example can include the alkaline etching solution of the first example wherein the hydroxide salt includes an alkali metal hydroxide.

A third example can include the alkaline etching solution of the second example, wherein the alkali metal hydroxide includes potassium hydroxide (KOH), sodium hydroxide (NaOH), lithium hydroxide (LiOH), rubidium hydroxide (RbOH), cesium hydroxide (CsOH), or a combination thereof.

A fourth example can include the alkaline etching solution of the third example, wherein the alkali metal hydroxide includes potassium hydroxide (KOH).

A fifth example can include the alkaline etching solution of the first example, wherein the hydroxide salt includes an ammonium hydroxide.

A sixth example can include the alkaline etching solution of the fifth example, wherein the ammonium hydroxide includes tetraalkylammonium hydroxide (TAAH).

A seventh example can include the alkaline etching solution of the sixth example, wherein the TAAH includes tetramethylammonium hydroxide (TMAH).

A eighth example can include the alkaline etching solution of any one of the first to seventh examples, wherein the alkaline etching solution has a pH of greater than or equal to about 13, 13.25, or 13.5.

An ninth example can include the alkaline etching solution of any one of the first to eighth examples, wherein the alkaline etching solution has a pH of less than or equal to about 14, 13.75, or 13.5.

A tenth example can include the alkaline etching solution of any one of the first to ninth examples, wherein the alkaline etching solution has a pH in a range of from about 13 to about 14, from about 13.25 to about 14, from about 13.5 to about 14, or from about 13.25 to about 13.5.

An eleventh example can include the alkaline etching solution of any one of the first to tenth examples initially (i.e., at the start of an etch) including: from about 2 to about 50, from about 2 to about 15, from about 5 to about 20, or from about 10 to about 50 weight percent of the hydroxide salt (e.g., alkali metal hydroxide, ammonium hydroxide, tetraalkylammonium hydroxide, or a combination thereof); from about 35 to about 85, from about 40 to about 80, from about 45 to about 85, or from about 35 to about 75 weight percent of the polyol; and from about 5 to about 50, from about 5 to about 45, from about 10 to about 40, or from about 20 to about 50 weight percent of the water.

A twelfth example can include the alkaline etching solution of any one of the first to eleventh examples, wherein a mass ratio of the polyol to water in the alkaline etching solution is initially (i.e., at the start of the etch) in a range of from about 0.5 to about 5, from about 1 to about 5, or from about 3 to about 4.

A thirteenth example can include the alkaline etching solution of any one of the first to twelfth examples, wherein the polyol has the formula R—(CH(OH))$_m$—R'—(CH(OH))$_n$—R", wherein m and n are each greater than or equal to 1 and/or m+n is greater than 3, or R—(CH(OH))$_x$—R', wherein x is greater than or equal to 3, wherein R, R', and R" each independently include hydrogen, a functionalized or non-functionalized alkyl, aryl, alkoxy, sulfoxide, or sulfone group, or another organic functional group that is stable under etching conditions.

A fourteenth example can include the alkaline etching solution of the thirteenth example, wherein the polyol has the general formula R—(CH(OH))$_x$—R'.

A fifteenth example can include the alkaline etching solution of the thirteenth or fourteenth examples, wherein the polyol includes glycerol, erythritol, xylitol, sorbitol, mannitol, or a combination thereof.

A sixteenth example can include the alkaline etching solution of any one of the thirteenth to fifteenth examples, wherein the polyol includes glycerol.

A seventeenth example can include the alkaline etching solution of any one of the first to sixteenth examples, where the polyol includes a polymeric polyol including a mixture of varying chain length polymers having one or more repeating monomer units, wherein one or more of the repeating monomer units have more than one hydroxyl group and/or wherein end groups of the varying chain length polymers contain more than one hydroxyl group.

An eighteenth example can include the alkaline etching solution of any one of the first to seventeenth examples, wherein the alkaline etching solution has a boiling point greater than the boiling point of water (i.e., greater than 100° C.).

A nineteenth example can include the alkaline etching solution of any one of the first to eighteenth examples, wherein the boiling point of the alkaline etching solution is greater than or equal to about 105° C., 110° C., 115° C., or 120° C.

In a twentieth example, a method of producing a semiconductor device includes: obtaining a semiconductor substrate having masked and unmasked surfaces; exposing the semiconductor substrate having the masked and unmasked surfaces to an alkaline etching solution, such that the unmasked surfaces of the substrate are anisotropically etched, wherein the alkaline etching solution includes: a hydroxide salt (e.g., an alkali metal hydroxide, an ammonium hydroxide, such as a tetraalkylammonium hydroxide, or a combination thereof); a polyol having at least three hydroxyl (—OH) groups; and water; and performing additional processing to produce the semiconductor device.

A twenty first example can include the method of the twentieth example, wherein exposing the semiconductor substrate to the alkaline etching solution further includes submerging the semiconductor substrate in a volume of the alkaline etching solution, wherein the volume of the alkaline etching solution has a temperature approximately equal to a boiling point of the alkaline etching solution, in a range of from about 3° C. to about 5° C. below the boiling point of the alkaline etching solution, or in a range of from about 5° C. to about 15° C. below the boiling point of the alkaline etching solution, and wherein a composition of the alkaline etching solution is maintained substantially constant for a duration of the exposing via intermittent or continuous removal of a portion of the alkaline etching solution and replacement by about a same volume of a fresh solution, wherein the fresh solution comprises at least one of the hydroxide salt, the polyol, and the water, such that a substantially constant etching rate of the unmasked surfaces is maintained for the duration of the etching process. The etching can be effected at a temperature above room temperature and below the boiling point of the alkaline etching solution.

A twenty second example can include the method of any one of the twentieth or twenty first examples, wherein the temperature of the volume of the alkaline etching solution is greater than or equal to about 85° C., 90° C., or 95° C.

A twenty third example can include the method of any one of the twentieth to twenty second examples, wherein the alkaline etching solution has a temperature that provides an acceptable etch rate, at which desired substrate net shape and surface characteristics are obtained.

A twenty fourth example can include the method of any one of the twentieth to twenty third examples, wherein the masked surfaces have deposited thereon a mask, wherein the unmasked surfaces of the substrate are etched at a substrate etching rate and wherein the mask is etched at a mask etching rate, and wherein an etching selectivity defined as a ratio of the substrate etching rate to the mask etching rate is greater than or equal to about 500, 600, 700, 800, 900, 1000, 2000, 3000, 4000, 5000, 6000, 7000, 8000, 9000, 10000, 11000, or 12000.

A twenty fifth example can include the method of the twenty fourth example, wherein the etching selectivity is in a range of from about 550 to about 12500, from about 600 to about 12500, or from about 700 to about 12500.

A twenty sixth example can include the method of the twenty fourth or the twenty fifth example, wherein the etching selectivity is greater than an etching selectivity obtained via etching of the semiconductor substrate with an otherwise same alkaline etching solution absent the polyol.

A twenty seventh example can include the method of any one of the twentieth to twenty sixth examples, wherein the masked surfaces have deposited thereon a mask, wherein the mask includes a material selected from silicon dioxide (SiO$_2$), silicon nitride (SiN$_x$), silicon oxynitride (SiO$_x$N$_y$), or a combination thereof, wherein the mask is grown by oxidation or deposited by a thin film method such as, without limitation, low pressure chemical vapor deposition (LPCVD) or plasma-enhanced chemical vapor deposition (PECVD).

A twenty eighth example can include the method of any one of the twentieth to twenty seventh examples, wherein the material of the mask includes a metal that is inert under the etching conditions, such as, without limitation, gold with a chromium adhesion layer.

In a twenty ninth example, a single crystal silicon substrate includes a single crystal silicon substrate fabricated such that its largest dimension is aligned with either a <100> or <110> plane of the crystal, into which 3-dimensional structures have been etched using an alkaline etching solution including a hydroxide salt (e.g., an alkali metal hydroxide, an ammonium hydroxide, such as a tetraalkylammonium hydroxide, or a combination thereof); a polyol having at least three hydroxyl (—OH) groups; and water.

In a thirtieth example, a semiconductor substrate includes: one or more etched regions, wherein the semiconductor substrate is aligned to either a <100> or <110> Miller Index plane, wherein edges of the one or more etched regions are aligned to the complementary <100> or <110> plane, and wherein the one or more etched regions are created via anisotropic etching with an alkaline etching solution including: a hydroxide salt (e.g., an alkali metal hydroxide, an ammonium hydroxide such as a tetraalkylammonium hydroxide, or a combination thereof); a polyol having at least three hydroxyl (—OH) groups; and water. The one or more etched regions can be rectangular or trapezoidal.

In a thirty first example, a microelectronic device wafer includes a microelectronic device wafer etched before, during, or after fabrication thereof using an alkaline etching solution including a mixture of a hydroxide salt, a polyol having at least three hydroxyl (—OH) groups, and water.

A thirty second example can include the microelectronic device wafer of the thirty first example, wherein the microelectronic device wafer is a complementary metal-oxide-semiconductor (CMOS) wafer, and wherein the hydroxide salt includes tetraalkylammonium hydroxide.

A thirty third example can include the microelectronic device wafer of the thirty first or the thirty second example, wherein the etched region defines at least one trench which serves to physically or electronically separate different regions of the wafer.

A thirty fourth example can include the microelectronic device wafer of the thirty first example or the thirty second example, wherein the etched region includes the back (inactive) face of the CMOS wafer, and wherein the back is etched to thin the CMOS wafer or chemically remove damage after a thickness of the CMOS wafer was reduced by other means.

A thirty fifth example can include the microelectronic device wafer of any one of the thirty first to thirty fourth examples, wherein the CMOS wafer is separated into individual substantially identical microelectronic devices, in whole or in part, by the etching.

A thirty sixth example can include the microelectronic device wafer of any one of the thirty first to thirty fifth examples, wherein the etched region provides a recessed area where one or more separately fabricated microelectronic devices can be attached after etching.

In a thirty seventh example, a method of forming an assembly of two or more wafers held together by temporary or permanent bonding between faces thereof comprises bonding the two or more wafers together with temporary or permanent bonding between faces thereof, wherein before or after the bonding, at least one of the two or more wafers is etched using an alkaline etching solution including a hydroxide salt (e.g., an alkali-metal hydroxide, an ammonium hydroxide, such as a tetraalkylammonium hydroxide, or a combination thereof); a polyol having at least three hydroxyl (—OH) groups; and water.

In a thirty-eighth example, "bleed and feed" technique is used to maintain nearly constant etch rates of all materials in the bath for the duration of the etch.

The particular examples disclosed above are illustrative only, as this description may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative examples disclosed above may be altered or modified and all such variations are considered within the scope and spirit of this description. Alternative examples that result from combining, integrating, and/or omitting features of the example(s) are also within the scope of the description. While compositions and methods are described in broader terms of "having", "comprising," "containing," or "including" various components or steps, the compositions and methods can also "consist essentially of" or "consist of" the various components and steps. Use of the term "optionally" with respect to any element of a claim means that the element is required, or alternatively, the element is not required, both alternatives being within the scope of the claim.

Numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. Use of "about", "similar", or "substantially" (e.g., "substantially constant" or "substantially the same") can indicate values within +10% or less, such as +10, +9, +8, +7, +6, +5, +4, +3, +2, or +1%. For example, a "substantially constant" etch rate can indicate an etch rate that changes by less than +10, +9, +8, +7, +6, +5, +4, +3, +2, or +1%, for example, during the course of an etch. If there is any conflict in the usages of a word or term in this specification and one or more patent or other documents, the definitions that are consistent with this specification should be adopted.

What is claimed is:

1. An alkaline etching solution comprising:
a hydroxide salt;
a polyol; and
water,
wherein the polyol has the formula:
R—$(CH(OH))_m$—R'—$(CH(OH))_n$—R", wherein m and n are each greater than or equal to 1 and/or m+n is greater than 3, and wherein R, R', and R" each independently comprise hydrogen, a functionalized or non-functionalized alkyl, aryl, alkoxy, sulfoxide, or sulfone group.

2. The alkaline etching solution of claim 1, wherein the hydroxide salt comprises an alkali metal hydroxide.

3. The alkaline etching solution of claim 1, wherein the hydroxide salt comprises a tetraalkylammonium hydroxide.

4. The alkaline etching solution of claim 3, wherein the tetraalkylammonium hydroxide comprises tetramethylammonium hydroxide.

5. The alkaline etching solution of claim 1, wherein the alkaline etching solution has a pH in a range of from about 13 to about 14.

6. The alkaline etching solution of claim 1, initially comprising:
from about 2 to about 50 weight percent of the hydroxide salt; from about 35 to about 85 weight percent of the polyol; and from about 5 to about 50 weight percent of the water.

7. The alkaline etching solution of claim 1, wherein a mass ratio of the polyol to water in the alkaline etching solution is initially in a range of from about 0.5 to about 5.

8. The alkaline etching solution of claim 1, wherein the polyol comprises erythritol, xylitol, or sorbitol.

9. The alkaline etching solution of claim 1, wherein the alkaline etching solution has a boiling point greater than 100° C.

10. The alkaline etching solution of claim 9, wherein the boiling point of the alkaline etching solution is greater than or equal to about 105° C.

11. The alkaline etching solution of claim 1, wherein the alkaline etching solution is at least 35 percent polyol.

12. A solution comprising:
a hydroxide salt;
a polyol; and
water,
wherein the polyol has the formula:
R—$(CH(OH))_m$—R'—$(CH(OH))_n$—R", wherein m and n are each greater than or equal to 1 and/or m+n is greater than 3, and wherein R, R', and R" each independently comprise hydrogen, a functionalized or non-functionalized alkyl, aryl, alkoxy, sulfoxide, or sulfone group.

13. The solution of claim 12, wherein the solution is at least 35 percent polyol.

14. The solution of claim 12, wherein the hydroxide salt comprises an alkali metal hydroxide.

15. The solution of claim 12, wherein the hydroxide salt comprises a tetraalkylammonium hydroxide or tetramethylammonium hydroxide.

16. The alkaline etching solution of claim 12, wherein the alkaline etching solution is at least 35 percent polyol.

17. An alkaline etching solution comprising:
a hydroxide salt comprising potassium hydroxide or tetramethylammonium hydroxide;
a polyol; and
water, wherein the alkaline etching solution is at least 35 percent polyol,
wherein the polyol has the formula:
R—$(CH(OH))_m$—R'—$(CH(OH))_n$—R", wherein m and n are each greater than or equal to 1 and/or m+n is greater than 3, and wherein R, R', and R" each independently comprise hydrogen, a functionalized or non-functionalized alkyl, aryl, alkoxy, sulfoxide, or sulfone group.

18. The alkaline etching solution of claim 17, wherein the alkaline etching solution has a pH in a range of from about 13 to about 14.

19. The alkaline etching solution of claim 17, comprising:
from about 2 to about 50 weight percent of the hydroxide salt; from about 35 to about 85 weight percent of the polyol; and from about 5 to about 50 weight percent of the water.

* * * * *